United States Patent [19]
Beall et al.

[11] 3,988,686
[45] Oct. 26, 1976

[54] DIGITALLY CONTROLLED ANALOG FLUX SENSING FERRITE PHASE SHIFTER DRIVER

[75] Inventors: Donald L. Beall, North Syracuse; Lee A. Talbot, Brewerton; Theodore N. Thompson, North Syracuse, all of N.Y.

[73] Assignee: General Electric Company, Syracuse, N.Y.

[22] Filed: Dec. 17, 1975

[21] Appl. No.: 641,635

[52] U.S. Cl. .............................. 328/155; 328/55; 333/24.1; 307/101
[51] Int. Cl.[2] ................................ H03B 3/04
[58] Field of Search ............. 328/155, 55; 307/230, 307/101; 333/24.1

[56] References Cited
UNITED STATES PATENTS

| | | | |
|---|---|---|---|
| 3,188,493 | 6/1965 | Malagari | 307/230 |
| 3,510,675 | 5/1970 | Johnson, et al. | 307/101 |
| 3,582,953 | 6/1971 | Martner | 333/24.1 |
| 3,699,584 | 10/1972 | Hrivnak et al. | 328/155 X |
| 3,835,397 | 9/1974 | D'Antonio | 328/155 |

Primary Examiner—John S. Heyman
Attorney, Agent, or Firm—Carl W. Baker; Joseph B. Forman; Frank L. Neuhauser

[57] ABSTRACT

The present invention relates to a digitally controlled phase shift network for an analog flux-sensing ferrite phase shifter driver, as would be applied in controlling the phase of individual antenna elements in phased array radar systems. The phase shift network described utilizes analog phase shifters while accepting a digital control input, and provides phase control without need for digital-to-analog converters between the analog phase shifters and their digital inputs. This is accomplished by integrating the volt-time product on the phase shifter secondary windings until the integral reaches a value corresponding to a phase shift increment of predetermined magnitude, dumping the integrator voltage between integrations, counting the number of integrate-and-dump operations to thus yield a digital measure of the phase shift achieved, and comparing such digital count against the digital control input. Nonlinearity of the differential phase-versus-flux characteristics of conventional phase shifters is compensated by causing the volt-time integration dump point to change upon reaching a predetermined point in the integrate-and-dump count.

5 Claims, 3 Drawing Figures

DIGITALLY CONTROLLED ANALOG FLUX SENSING FERRITE PHASE SHIFTER DRIVER

BACKGROUND OF THE INVENTION

The Government has rights in this invention pursuant to Subcontract MDAC-72-C-001 (Prime Contract DAHC60-72-C-0080) awarded by the Department of the Army.

The present invention relates to phased array antenna systems wherein component elements of the antenna array are subject to individual phase adjustment by operation of analog flux-sensing ferrite phase shifters each associated with one of the antenna elements. More particularly, the invention relates to driver networks for providing control of such analog phase shifters in response to digital control signal inputs, and if desired, also providing compensation for nonlinearities in phase shifter operating characteristics.

To accomplish the necessarily very complex and high data rate processing of both intelligence and control signals in phased array radar systems it generally is believed preferable if not practically essential that such signals be generated and processed in digital form, as opposed to analog. It therefore becomes necessary, in systems which incorporate analog ferrite phase shifters, to appropriately interface these analog devices with their digital control signal inputs. Normally this is accomplished by provision of a digital-to-analog converter which is individual to each of the phase shifters, and while such arrangement may be satisfactory operationally it tends to become expensive, for the cost of such converters in the number required for a typical phased array radar system can be quite large.

Additionally, the phase shifter drive circuitry which accepts the analog control signal after conversion from digital, and which controls the volt-time integral and thereby the ferrite magnetization, has also tended to be expensive. This again is due primarily to the very large number of such drive circuits required. For these reasons any simplification and cost reduction in phase shifter control circuitry, either with respect to the circuitry for digital-to-analog conversion of driver inputs or the circuitry of the drivers themselves, can become very substantial when multiplied by the large numbers of these equipments which are needed in conventional phased array radar systems.

As has been recognized, conventional ferrites have nonlinearly spaced remanent states as a function of the volt-time integral of the drive signal. A number of different techniques, some quite effective, have been introduced to correct such nonlinearity. Generally these techniques have involved specialized design and construction of the phase shifter magnetic and associated waveguide structures, or the introduction of complementary nonlinearity in the phase shifter driver circuits. Again, while these prior art techniques for drive linearization have functioned effectively, they have tended to become relatively expensive in large arrays, and for this reason circuit simplification is of particular importance in the design of such arrays.

SUMMARY OF INVENTION

Accordingly, it is an object of the present invention to provide an improved digitally controlled phase shift network for the analog phase shifters in a phased array antenna system.

It is a further object of the invention to provide a digitally controlled phase shift network wherein stepped remanent states of a ferrite element are utilized, and wherein the need for a digital-to-analog converter is eliminated by direct digital comparison of the digital input signal and a digital measure of the differential phase parameter under control.

It is yet another object of the invention to provide a digitally controlled phase shift network wherein successive remanent states of a ferrite element are utilized, wherein there is direct digital comparison of the digital input control signal and the differential phase parameter under control, without first converting the digital input signal to analog, and wherein compensation for nonlinearity of the differential phase-versus-flux characteristic is introduced by the direct digital comparison means with little additional circuit complexity or cost.

These and other objects, features and advantages of the invention are achieved in a digitally controlled phase shift network through a digital countdown technique which enables a direct digital comparison of the digital input signal against the differential phase parameter under control, i.e., the volt-time integrals corresponding to the different phase shifter remanent states. This is accomplished by obtaining a measure of differential phase through successive integrations of volt-time values on the phase shifter secondary windings for each increment or least significant bit (LSB) of phase shift, dumping the integrator voltage after each such integration, and then counting the number of such integrate-and-dump operations thereby to obtain a digital measure of the state of magnetization of the ferrite. In the preferred embodiment the normal nonlinearity of the differential phase versus flux characteristic is compensated by causing the integration voltage dump point to change at a predetermined point in the integrate-dump and count cycle.

BRIEF DESCRIPTION OF DRAWING

The novel and distinctive features of the invention are set forth in the claims appended hereto. The invention itself, however, together with certain of its further objects, features and advantages, may best be understood by reference to the following description and the accompanying drawings, in which:

DESCRIPTION OF THE PREFERRED EMBODIMENT

Radar and communications systems embodying phased array antennas of the type with which the phase shifter driver of the present invention has its primary application are well known in the art and well described in the literature. For example, U.S. Pat. No. 3,835,397 to D'Antonio describes a radar system with phased array antenna and explains the manner in which the necessary digital control signals for the antenna element phase shifters may be provided by a beam steering computer of digital type. This computer derives digital control signals for application to the phase shifter drivers associated with the individual elements of the array, as necessary to perform the desired array beam forming and beam steering functions.

Figure 1:
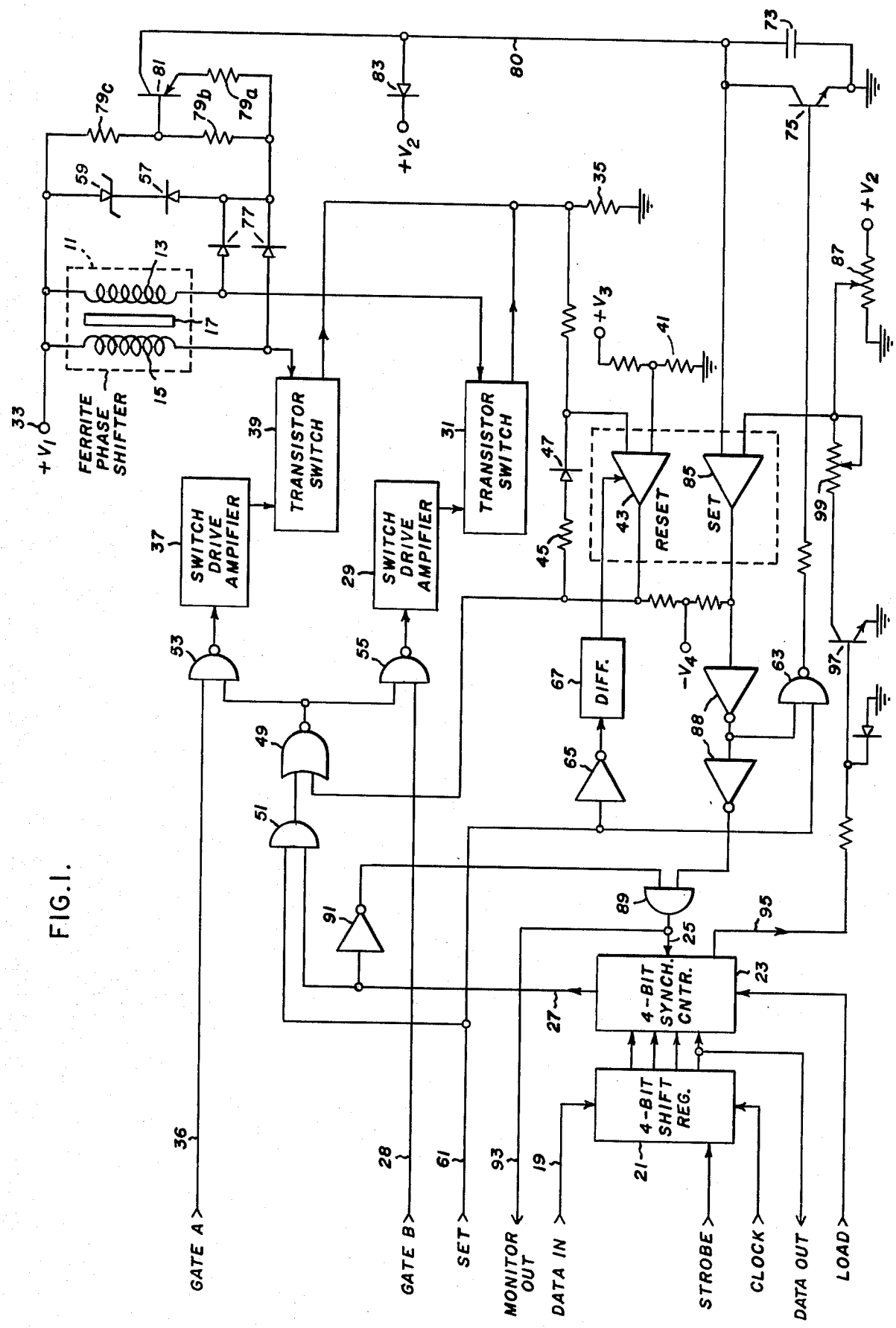
FIG. 1 is a circuit diagram of a digitally controlled analog flux sensing ferrite phase shifter driver network in accordance with the invention.

Referring now to FIG. 1 herein, the phase shifter for one radiation element of the antenna array is designated generally by reference numeral 11, and the associated driver circuit for that phase shifter is constituted by the remainder of the circuitry shown. As previously noted, phase shifter 11 is of conventional type comprising a magnetizable core of square loop material, which typically may be a form of garnet or other ferrite, and which may be driven between two fully saturated states or positioned at intermediate points on its B-H loop depending upon the starting point for the drive current and the volt-time integral of that current.

In common with most other driver circuits of flux sensing type, the phase shifter driver circuitry of the invention utilizes two oppositely-poled control windings 13 and 15 within or otherwise coupled to the phase shifter ferrite core 17. As is also the common practice with phase shifters of this type, the required differential phase shift is obtained by first resetting the ferrite to a reference state on its major B-H loop, using one of the two control windings to drive the core to one fully saturated state. The ferrite is then set to yield the required differential phase shift, i.e., to an intermediate point on a minor B-H loop, by a properly controlled drive current applied to the other of the two windings.

The driver circuitry must of course also be capable of resetting the ferrite to the other of its two saturated states, and then setting it to the desired intermediate point on the minor B-H loop for the desired differential phase shift, by supply of drive currents to the control windings in reverse sequence. The manner in which the necessary sequencing and control of these phase shifter drive currents, which of course are analog in character, are derived from the input control signals which are digital in character, without use of a digital-to-analog converter, is the subject of the present invention.

In brief, and as will be explained in greater detail hereinafter, this is accomplished in accordance with the invention by integrating the volt-time product on the phase shifter secondary winding and dumping the integrator each time a predetermined value of this integral is reached, thus providing a succession of phase shift increments all of known identical magnitude. These increments are counted, and in this way a digital representation of total achieved phase shift is obtained. Such count is compared aginst the digital input command, and the phase shift drive operation then is concluded when correspondence with the input command is achieved.

The digital input command may be generated by a beam steering computer and command signal generator of conventional configuration, such as described in the aforementioned D'Antonio — U.S. Pat. No. 3,835,397, for example. The input signal is applied to the phase shifter driver circuit on the data input line 19 of a four-bit shift register 21 also having clock and strobe inputs as shown. Depending upon the size of the phase shift steps or increments into which the total possible phase shift of 360° is to be divided, this input command may represent any number from 1 to 16 different values of phase shift or levels of phase shifter core remanent magnetization. For example, in a typical application a phase shifter exhibiting 16 remanent states would produce phase shifts in angle increments of 22.5°, embracing a range of from 0° to 337.5° to total phase shift. In such case the command signal input to the shift register 21 would be in the form of a representation of the appropriate one of the digital numbers 0–15 representing the total phase shift to be introduced.

The four-bit differential phase command is serially entered into the shift register 21 during a data input time block under control of the strobe input shown. Then, upon a load command subsequently received from the beam steering computer, the differential phase command is transferred into a four-bit synchronous counter 23, This counter may be of conventional type, having a downcount input on line 25 and a borrow or carry output on line 27, on the latter of which lines there appears a 1 output when the count then standing in counter reaches 0000.

If it is desired to phase the array for transmit operation, the reset portion of the phasing cycle is commenced by application of an input command from the beam steering computer to the Gate B input on line 28. This begins the reset operation by gating on a first switch drive amplifier 29, thereby closing a first transistor switch 31 and enabling the flow of magnetizing current from a suitable DC voltage source (not shown) connected to terminal 33. The current flow is through a first of the two phase shifter windings 13, then through a series-connected resistor 35 the function of which is to enable a measurement of magnetization current as hereinafter explained.

Conversely, if it is desired to phase for receive operation, the reset portion of the phasing cycle will be commenced by raising Gate A by application of such command from the beam steering computer, on line 36. This gates on a second switch drive amplifier 37 which closes a second transistor switch 39 to pass current flow through the second of the phase shifter windings 15 and through the current measuring resistor 35 in series therewith, to reset the ferrite to its opposite state of saturation.

Following energization in this manner of either of the oppositely poled windings 13 and 15, to reset the phase shifter core in the desired direction to one of its fully saturated states, the other of the two windings then is energized and set current caused to flow as necessary to adjust the phase shifter remanent magnetization state along its minor B-H loop to the desired differential phase value. Thus for reset and set of the phase shifter in opposite directions, the sequence of energization of the two windings simply is reversed.

The voltage across the current sensing resistor 35 provides an indication of phase shifter core saturation. This voltage is compared against a fixed reference which is provided through a voltage divider 41 by a voltage source $V_3$, in a reset comparator to which the reference and reset voltage are the two inputs. When the reset voltage exceeds the reference voltage, the output of the reset comparator 43 rises and the resulting 1 output is applied both to cause the reset drive to shut down and also to latch the reset comparator. Such latching prevents the reset drive from self-reactivating when the reset drive is shut down and the reset current flow through resistor 35 drops. This latching of the reset comparator is accomplished by positive feedback through a loop comprising a resistor 45 and diode 47 connected as shown.

To shut down the reset drive, the 1 output from comparator 43 is applied as an input to a logic NOR element 49, which has as its second input the output of a logic AND element 51 the inputs to which will be explained hereinafter. The operation of the logic NOR element 49 is such that whenever the element receives a 1 input from comparator 43, its inverted output becomes a 0 into each of two logic NAND elements 53 and 55 which respectively control the A and B gates. A 0 input to either of these gates will lower the gate and thus terminate the reset drive through it.

The gate pulse itself, as applied to the Gate A or Gate B input from the associated beam steering computer, is of a time duration substantially longer than the time usually required for the ferrite magnetization current to reach the level necessary to trip the reset comparator, so that in normal operation of the circuit it is the reset comparator which acts to drop the open gate and terminate the reset drive current.

Before commencing the set portion of the phasing cycle, it is necessary to dissipate the energy stored in the ferrite when the reset drive is completed. To accomplish this, the two phase shifter windings 13 and 15 are bypassed by diodes 77, 57 and 59, the last-enumerated of which is a zener diode in which the stored energy is dissipated. The phase shifter core then remains in its reset remanent state, ready for the beginning of the set portion of the phasing cycle.

This is initiated by a set signal input from the associated beam steering computer, on line 61, which is applied as one of the inputs to the logic AND element 51 previously mentioned. The set signal also is applied as one input to another logic NAND element 63, and through a logic inverter 65 to a double edge differentiating circuit 67 the output of which unlatches the reset comparator 43. Such unlatching is desired in order to enable the reset comparator to be operational during the set portion of the phasing cycle, for purposes of overcurrent protection in case the required amount of flux to reach the called-for differential phase shift cannot be achieved for any reason. If this occurs, the reset comparator will again ouput a 1 when the saturation current level is reached, to thus terminate the set cycle in the same manner as it normally terminates the reset cycle.

Considering now the operation of AND gate 51, in addition to its set signal input it also receives an input from the "borrow" output of the synchronous counter 23, which at this time is a 0. Gate 51 accordingly will also output a 0 as its input to the NOR element 49. The other input to this NOR element changes to a 0, however, as a consequence of the unlatching of reset comparator 43 by operation of the set signal input to that comparator through differentiator 67.

The inverted output of NOR element 49 accordingly becomes a 1, and this 1 input to the NAND elements 53 and 55 enables the gates formed thereby to open the switch drive amplifiers 29 and 37, respectively. Thus if at any time during the period of the set gate input on line 61, there is applied a gate signal input on either the Gate A input line 36 or the Gate B input line 28, the appropriate one of the two transistor switches 31 and 39 will be turned on to drive the ferrite in the proper direction to achieve the desired differential phase shift.

For control of the magnitude of this differential phase shift, flux sensing means is provided. In the preferred embodiment illustrated this takes the form of a volt-time integrating capacitor 73 which, until the start of the set portion of the phasing cycle, is effectively shorted by a transistor switch 75 connected across the capacitor and controlled by the set signal input through the NAND element 63 previously mentioned. As will be further described later, transistor switch 75 is turned off at the start of the set signal, thus removing this short across the integrating capacitor 73 and enabling the start of integration.

During the set portion of the phasing cycle, the secondary voltage generated across whichever of the phase shifter windings 13–15 is not then energized will be applied through one of the two diodes 77 to a transistor 81. This transistor with its associated resistor network 79a, 79b and 79c forms a current source providing on line 80 an output current of magnitude which is directly proportional to the phase shifter winding secondary voltage.

Such current is applied to capacitor 73 and integrated thereby, to yield a current-time integral which, due to the direct proportionality between this current and the secondary voltage, also constitutes a volt-time integral. There accordingly will be formed on the capacitor a voltage proportional to the integral of the secondary voltage with respect to time, and since magnetic flux is proportional to that integral, flux sensing is achieved in this manner.

The voltage source $V_2$ and diode 83 shown connected to line 80 do not affect the integration process, since the diode normally is reverse-biased. These elements desirably are included, however, for the protection of the set comparator 85 to which the volt-time integration product is applied as one input. Set comparator 85 has as its other input a set voltage reference which conveniently may be derived from the same voltage source $V_2$ previously mentioned.

The fractional part of this reference voltage which is applied to the set comparator is determined by a voltage divider 87 the setting of which determines the magnitude of the phase shift increment which will cause the set comparator to output a 1. This in turn determines the magnitude of the smallest differential phase shift, i.e., least significant bit (LSB) of flux differential, which is sensed by the set comparator and counted by the circuitry now to be described.

When this LSB of differential phase shift has been achieved, the output of set comparator 85 rises to a 1. This output is applied to an AND element 89 through two inverting amplifiers 88, at the point of connection between which the set comparator output now becomes 0. Such signal when applied to logic NAND element 63 causes its inverted output to become a 1, which turns the transistor switch 75 on and again shorts out the integrating capacitor 73. The resultant drop of the capacitor voltage causes the set comparator output to revert to 0, causing the counter down clock input to fall and decrementing, by one, the count then standing in the synchronous counter 23.

The set comparator input to logic NAND element 63 now switches back to a 1, and since the set signal input on line 61 to the other input of this NAND element still is a 1, and remains so through the entire set portion of the phasing cycle, transistor switch 75 will immediately be reopened to enable the sensing and measurement of the next LSB of phase shifter flux.

It will be noted that the drive current through the phase shifter winding is not interrupted while the integrating capacitor is being dumped or discharged after integration of each LSB, so the small fraction of the total time cycle necessary to this operation is not included in the volttime integration. Because the capacitor discharge time is relatively very short as compared to the integration time, however, the possible error thus introduced is relatively small even without compensation, and it can be compensated out in substantial part by proper calibration of the various voltage references which control operation of the system.

The foregoing sequence of integration of one LSB of phase shifter flux drive, followed by dumping of the integration capacitor charge and a unit down-count of the synchronous counter, then a successive series of unit decrements, will continue until the synchronous counter has down-counted its running count to 0000. Counter 23 is decoded internally so as to cause the borrow output in line 27 to rise when this 0000 count is reached, and such borrow output as applied to AND element 89 through inverting amplifier 91 blocks any further input of count pulses from the set comparator 85. At the same time, the borrow output to AND element 51 operates to terminate the phase shifter drive current by closing the open gate 53 or 55, whichever is then still open, thus concluding the set portion of the phasing cycle.

It will be noted that the serial string of pulses which is generated at the output of the set comparator, which resets the integrator and decrements the counter, may also be outputted as a series of monitor pulses on line 93 for transmittal back to the beam steering computer which supplied the differential phase shift command. The beam steering computer may then be programmed to count these monitor pulses and to compare them with the original differential phase shift command, to provide a back-up check on the accuracy of the phase shifter operation and assure its conformance to the differential phase shift command to within one LSB of phase shift.

Figure 2:
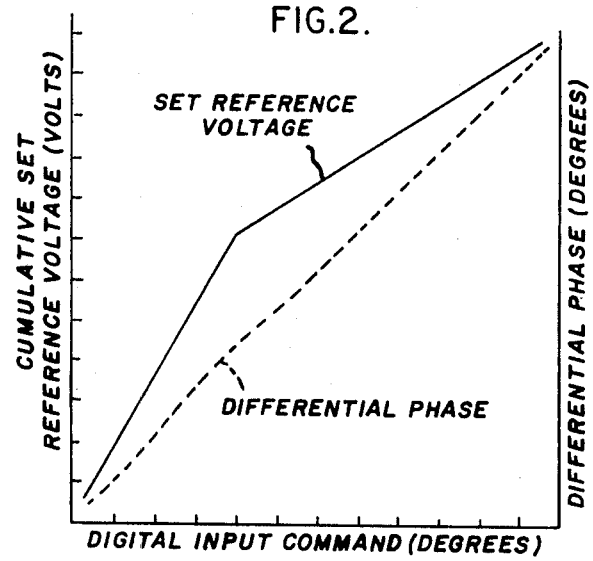
FIG. 2 is a plot of the differential phase shift as a function of phase shifter volt-time integral in the circuit of FIG. 1, illustrating the preferred mode of compensation of nonlinearity in the differential phase-flux relationship.

As previously mentioned, the differential phase shift versus core flux relationship in conventional ferrite phase shifters is nonlinear, so compensation in some manner for this nonlinearity is necessary to optimize the accuracy of phase shifter settings over their entire range, particularly where the range of phase shift values is large. FIG. 2 is a plot of differential phase shift against the volt-time integral, and demonstrates the required compensation for linearizing this relationship.

Typically the breakpoint in the curve of differential phase shift versus volt-time integral occurs at approximately the 180 degree point, and below that point it is necessary to increase the set reference voltage, i.e., the increments of differential phase shift, per unit change of integrator output voltage, in order to obtain the desired compensation. However, the procedures necessary to determine the crossover at which such increase should be made using the down count technique of the present invention are somewhat complicated, because of the variable decoded state which is required to locate the break in the cumulative set reference voltage. This will, of course, be different depending upon the input differential phase shift command.

In accordance with the invention, acceptably accurate approximation to the desired linearity compensation may be achieved simply by effecting an increase of fixed magnitude in the set reference voltage, and thus in the size of the LSB, at the point at which the most significant bit (MSB) of the counter changes from a 1 to a 0. This marks the 180° point which, as indicated in the curve of FIG. 2, is acceptably close to the breakpoint in the linear approximation of the actual differential phase versus set reference voltage curve. Such implementation of the required correction for phase shifter nonlinearity is particularly advantageous here, because the MSB is readily available as an output from conventional synchronous counters such as at 23.

The MSB output appears on lead 95. When that output shifts from a 1 to a 0 this switches off a normally-on transistor 97, disconnecting from ground a resistor 99 connected in parallel with the voltage divider 87 which provides the set reference voltage to set comparator 85. The reference voltage thus is increased, causing a corresponding increase in the size of the LSB or phase increment which is measured and counted by the set comparator and counter. In this way a very good approximation to full linearization of the differential phase versus phase input command curve is obtained with a little additional circuit complexity or cost.

Figure 3:
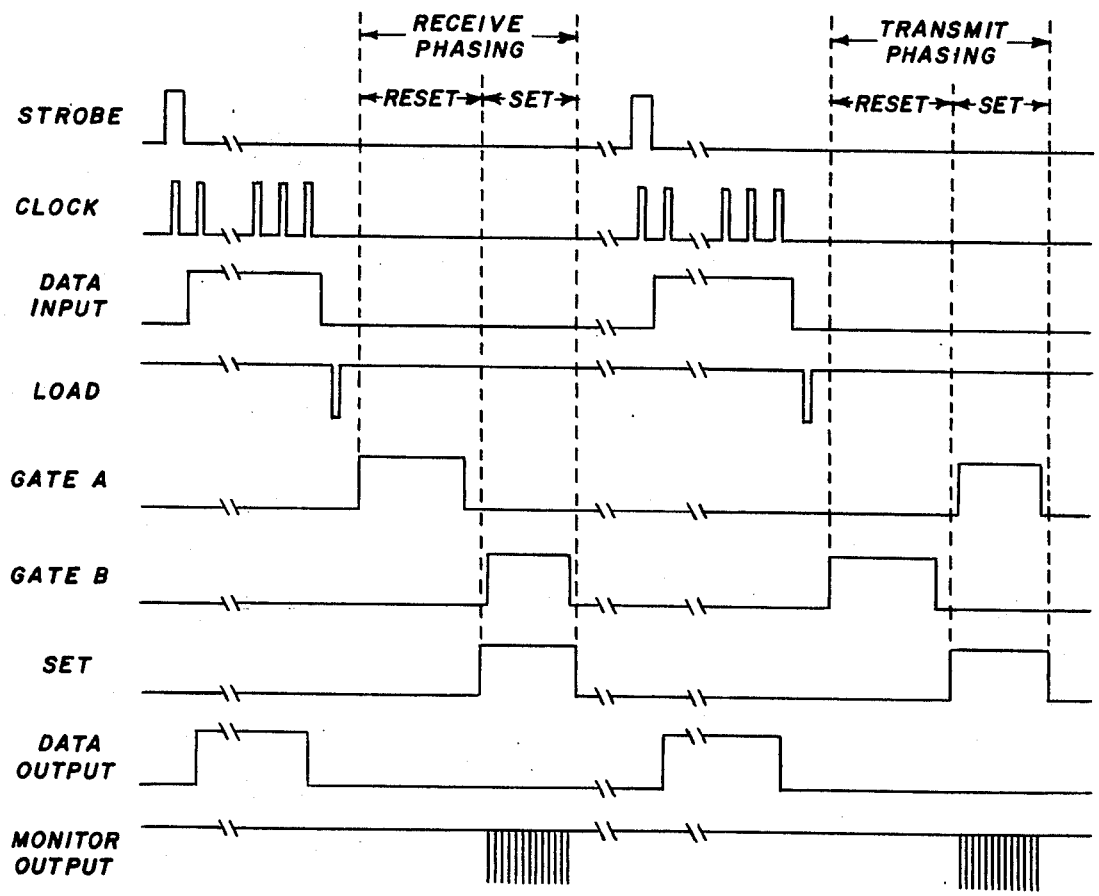
FIG. 3 is a timing diagram illustrating time relationships in the driver network of FIG. 1.

The operation of the phase shifter driver of this invention is believed obvious from the foregoing description of the driver circuitry, but its operation will be briefly further described with reference to the timing diagram of FIG. 3. In that figure, the strobe pulse input triggers the data input to shift register 21, for serial entry therein, and the load command signal to synchronous counter 23 then transfers the differential phase command into that counter. If it is desired to phase for receive, Gate A then will be raised as indicated by the Gate A waveform and will be held open a time period sufficiently long to assure a reset of the phase shifter core and until after the reset comparator has been tripped. Shortly thereafter, Gate B is raised and, substantially concurrently therewith, a set signal input triggers the start of the set portion of the phasing cycle as previously described. During the course of this cycle, the "monitor out" signal makes available to the associated beam-forming computer the down-count signal input to the synchronous counter 23, to enable verification of the conformance of the phase shifter to its input command. For transmit phasing the sequence simply is reversed.

It will be appreciated that many changes may be made in the phase shifter driver of the present invention. For example, the phase shift increment counter implementation could employ, in lieu of a down-count from the input digital phase command to 0000, an up-count from zero to the digital input phase command. These and other modifications in accordance with the present invention will be obvious to those skilled in the art and the appended claims are intended to cover all such modification as fall within the true spirit and scope of the invention.

What is claimed and desired to be secured by Letters Patent of the United States is:

1. A digitally controlled phase shift network comprising:
   a. an analog phase shifter having a magnetizable core exhibiting plural magnetic states and differential phase shift varying correspondingly with the integral of an applied magnetic flux drive;
   b. magnetization current supply means for said phase shifter including a magnetizing current source and switch means operable to control flow of magnetizing current from said source to said phase shifter;
   c. digital counter means connected to receive a digital input signal for entry of an initial count therein, said counter means being operative upon application of each count input pulse to effect a unit change in a running count therein and operative upon said running count reaching a magnitude determined by said initial count to generate an output pulse;

d. input means for generating a digital input signal representing a called-for value of phase shifter differential phase shift and applying such signal to said digital counter means for entry therein as said initial count;

e. voltage responsive means connected to said phase shifter for response to an operating voltage having predetermined relationship to phase shifter magnetic flux, said voltage responsive means including means for integrating such voltage with respect to time to thereby provide a volt-time integral indicative of the differential phase shift effectuated by said magnetizing current;

f. control means connected to said volt-time integration means and operative to zero the volt-time integral each time it reaches a predetermined value representative of a differential phase shift increment of predetermined unit magnitude, and operative simultaneously to apply a phase shift increment count pulse input to said digital counter means thereby to effect a unit change in the running count in said counter; and g. means responsive to said digital counter output pulse to open said switch means to thereby cut off current flow to said phase shifter when the running count in said digital counter reaches said predetermined magnitude indicating that the called-for value of differential phase shift has been achieved.

2. A phase shift network as defined in claim 1 wherein said volt-time integration means comprises a capacitor across which said operating voltage is applied, and wherein said control means is effective to short the capacitor momentarily when the integral reaches said predetermined value, to thus enable successive integrations each of a common volt-time value.

3. A phase shift network as defined in claim 1 wherein said digital counter means is responsive to each phase shift increment count pulse input to effect a unit down-count in the running count in said counter, and wherein said predetermined magnitude of the running count at which said output pulse is generated by said counter is zero.

4. A phase shift network as defined in claim 1 wherein said phase shifter comprises oppositely poled control windings sequentially energized for reset and set of the magnetic state of the phase shifter core, and wherein said operating voltage applied to said volt-time integration means is the secondary voltage generated across one of said windings by flow of said magnetizing current through the other thereof.

5. A phase shift network as defined in claim 1 further including compensation means for nonlinearity in the relationship of differential phase shift to magnetic flux drive, comprising means responsive to the running count in said digital counter reaching a second predetermined magnitude to change the predetermined value of said volt-time integral corresponding to said unit magnitude phase shift increment.

* * * * *